United States Patent [19]
Kreiser

[11] Patent Number: 4,962,474
[45] Date of Patent: Oct. 9, 1990

[54] LSSD EDGE DETECTION LOGIC FOR ASYNCHRONOUS DATA INTERFACE

[75] Inventor: Paul D. Kreiser, Rochester, Minn.

[73] Assignee: International Business Machines Corporation, Armonk, N.Y.

[21] Appl. No.: 121,611

[22] Filed: Nov. 17, 1987

[51] Int. Cl.$^5$ .............................................. G06F 3/00
[52] U.S. Cl. .................... 364/900; 364/932.8; 364/927.92; 364/927.93
[58] Field of Search ... 364/200 MS File, 900 MS File; 371/28, 25, 15

[56] References Cited

U.S. PATENT DOCUMENTS

| | | | | |
|---|---|---|---|---|
| 4,100,605 | 7/1978 | Holman | ............................... | 364/900 |
| 4,225,959 | 9/1980 | Doty, Jr. et al. | ..................... | 371/15 |
| 4,298,980 | 11/1981 | Hajdu et al. | ......................... | 371/25 |
| 4,362,957 | 12/1982 | Stern | ..................... | 371/25 |
| 4,477,902 | 10/1984 | Puri et al. | ............................. | 371/25 |
| 4,564,943 | 1/1986 | Collins et al. | ......................... | 371/28 |

*Primary Examiner*—Raulfe B. Zache
*Attorney, Agent, or Firm*—Hugh D. Jaeger

[57] ABSTRACT

An interface between a computer and an asynchronous communications line in which asynchronous data on the communications line sets a register made up of latches designed according to LSSD rules, which is then read out and reset in synchronism with the computer. The latches for each individual bit position of the register are edge triggered providing for maximum speed of transmission and are designed to be tested using LSSD test criteria. Data is frozen in the register upon receipt of a data valid signal. The contents of the register are then synchronously gated internally within the computer.

14 Claims, 3 Drawing Sheets

LSSD EDGE DETECTION LOGIC FOR ASYNCHRONOUS DATA INTERFACE

TECHNICAL FIELD

This invention relates to an interface which includes an edge detection circuit, conforming to level sensitive scan design (LSSD) design rules, having particular application to the conversion of data from an asynchronous communication line to an internal register of a synchronous computer.

BACKGROUND ART

LSSD circuits have become more and more attractive for use as the size and complexity of integrated circuit chips has increased. The evolutionary increase in size, density and complexity lead to improved methods of testing and the design of circuits which are configured to enhance their testability.

Despite the existence of certain attractive aspects of LSSD circuits, they are limited to the response to input levels. That is, the level of an input signal (high or low) dictates the state that the receiving latch will go when it is clocked. The edge of a signal (transition) is not of consequence in these designs since all signals are stable when the system's synchronizing clock are activated. For this reason, interfacing LSSD circuits to devices which run asynchronously requires that the signals being received be synchronized to the receiving system clock before they are acted upon. Such synchronization always requires a wait period. This time delay penalty has an adverse impact on the system performance.

The LSSD circuits, which follow the rules generally described in U.S. Pat. Nos. 3,761,695; 3,783,254; and 3,784,907 are exemplary of efforts to enhance testability.

*IBM Technical Disclosure Bulletin*, Vol. 21, No. 10, March, 1979, p. 4166, "Set/Reset Shift Register Latch", D. E. Gates and W. G. Verdoorn, Jr., describes an LSSD shift register latch that is capable of being set and reset asynchronously. In this circuit, the system clock must be active to allow the latch to be either the set or reset.

*IBM Technical Disclosure Bulletin*, Vol. 23, No. 5, October, 1980, p. 2013, "Edge Triggered Latch Design", R. A. Johnson, describes an edge triggered Latch which is limited to synchronous operation.

*IBM Technical Disclosure Bulletin*, Vol. 24, No. 1A, June, 1981, p. 404, "Signal Transition Detection Circuit", J. W. Cannon and B. D. Herrman, describes an edge triggered latch which is intended for synchronous operation.

*IBM Technical Disclosure Bulletin*, Vol. 24, No. 2, July, 1981, p. 1038, "Level Sensitive Scan Design Testable Asynchronous Set/Reset Latch", is descriptive of a synchronous latch in which the scan clock is used to reset the latch.

U.S. Pat. No. 4,277,699, Brown et al., shows a "D" type flip flop which utilizes a synchronous clock signal.

*IBM Technical Disclosure Bulletin*, Vol. 27, No. 12, May, 1985, p. 7120, "LSSD Design Techniques", discloses techniques for meeting the rules of LSSD in an edge triggered shift register latch. The latch is designed for synchronous operation.

U.S. Pat. No. 4,580,137, T. S. Fielder and R. P. Moore, shows a latch circuit which provides synchronous and asynchronous clocking. This patent contains an exceptionally complete review of the various aspects of LSSD latch design.

U.S. Pat. No. 4,692,633, C. H. Ngai and G. J. Watkins, shows a latch design for synchronous operation.

DISCLOSURE OF THE INVENTION

It is therefore an object of this invention to provide an edge triggered latch which satisfies LSSD rules which can be set asynchronously and read out by a synchronous clock.

It is another object of this invention to provide an asynchronously set, edge-triggered LSSD latch which has a minimum number of components but which can be read out with a synchronous clock.

It is still another object of the invention to provide an LSSD interface between an asynchronous data input bus, such as a communications line, and the internal registers of a computer.

According to one aspect of the invention, there is provided an edge triggered LSSD latch interface register which continuously follows the data on an input bus until the transmitting station signals that the current data is valid. At this point the interface register status remains constant to allow the attached computer to transfer the data to an internal register. Immediately on fixing the status of the register, the transmitting station is informed that the data has been captured, allowing the transmitter to initiate the next following transmission. After the computer effects the transfer of data from the latch to its internal registers, it looks for a data valid signal from the transmitter to begin a new transfer operation.

The foregoing and other objects, features and advantages of the invention will be apparent from the more particular description of the preferred embodiment of the invention as illustrated in the accompanying drawings.

DESCRIPTION OF THE INVENTION

Figure 1:
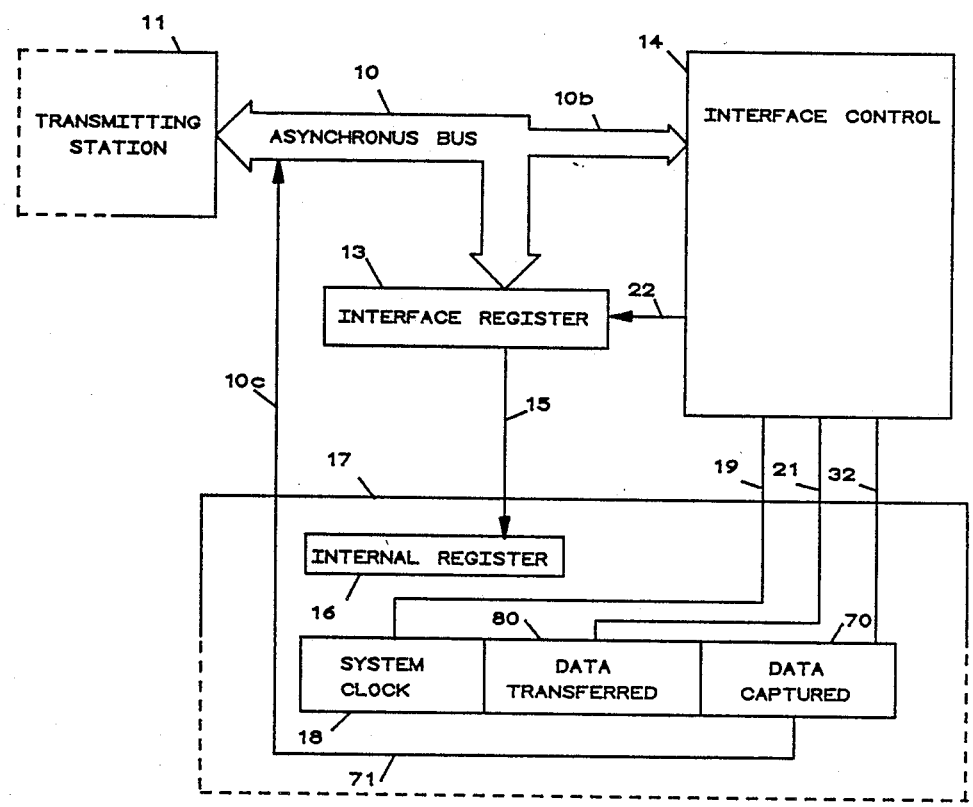
FIG. 1 is a system diagram showing the relationship between the transmitting device, the receiving computer, the interface control and the communications data register.

Referring to FIG. 1, an asynchronous data bus or communications line 10, coming from a transmitting station such as another computer, terminal or peripheral device 11, has a plurality of individual conductors such that a signal can be represented by 32 bits in parallel as well as accommodating the transfer of control signals between the transmitting station 11 and the receiving station, which may be a computer 17 over the data bus 10. Data bus 10 feeds interface register 13 made up of LSSD latches or other equivalent circuits. The individual latches which make up the bit positions in interface register 13 continuously follow the changes in the data on bus 10. In other words, the latches which make up the interface register 13 continuously follow the signal changes on the individual lines of data bus 10.

Certain of the lines in data bus 10 extend to the interface control unit 14 through bus 10b. These lines are used to convey control signals between the transmitting station 11 and the interface control unit 14.

The output bus 15 of interface register 13 is shown connected to internal register 16 of computer 17. While the output bus 15 of register 13 is shown to be connected to a register, it will be appreciated that alternative or additional connections are possible. For example, instead of leading directly to a predetermined register, the output bus 15 could be gated onto an internal bus of the computer and transferred to other registers, not shown.

Computer 17 contains logic for developing certain control signals developed for interface control unit 14. Clock signals are derived from the synchronous internal clock 18 of the computer and transferred to the interface control over line 19. When data is transferred from the data bus 10 to interface register 13, the computer develops a Data Captured signal, in response to the signal on line 32, through logic or software, and places the signal on bus 10c to the transmitter. When the computer completes the transfer of data from interface register 13 to an internal register 16, a Data Transferred signal is developed on line 21 to the interface control unit 14. Conventional means are used to develop these signals. Special purpose dedicated logic circuits or software can be used for this purpose. The particular manner in which these signals are developed will depend in large part on the availability of resources within the computer.

The transfer of data from transmitting station 11 to computer 17 begins when the transmitter places data on the bus 10. The actual signals on data bus 10 may be time varying, that is, the voltages on the bit lines may be continuously changing. The individual latches making up the interface register 13 may follow the signal changes on data bus 10. That is, as the individual signals on the bit lines change, the corresponding latches change status to reflect such changes. In this manner, the content of interface register 13 continuously follows the data existent on bus 10.

When the transmitter signals that the data on bus 10 is valid, by sending a Data Valid signal over bus 10 and extension 10b, the interface control unit 14 asynchronously terminates the input control signals (clock signals) on line 22, thereby freezing the condition of interface register 13 with the content of bus 10 at the time the Data Valid signal was sent. The computer 17 also responds to a corresponding signal on line 32 to develop a Data Captured signal, which is returned to the transmitter over a line on bus 10c.

At this point the data to be transferred has been asynchronously stored in interface register 13 and is available for transfer to internal register 16 within computer 17, under the control of computer synchronous internal clock 18. This transfer is effected synchronously, and when completed, results in a Data Transferred signal on line 21 which informs the interface control unit 14 that a new transfer cycle can be initiated. The interface control responds to this signal by again allowing interface register 13 to follow the data on bus 10.

Figure 2:
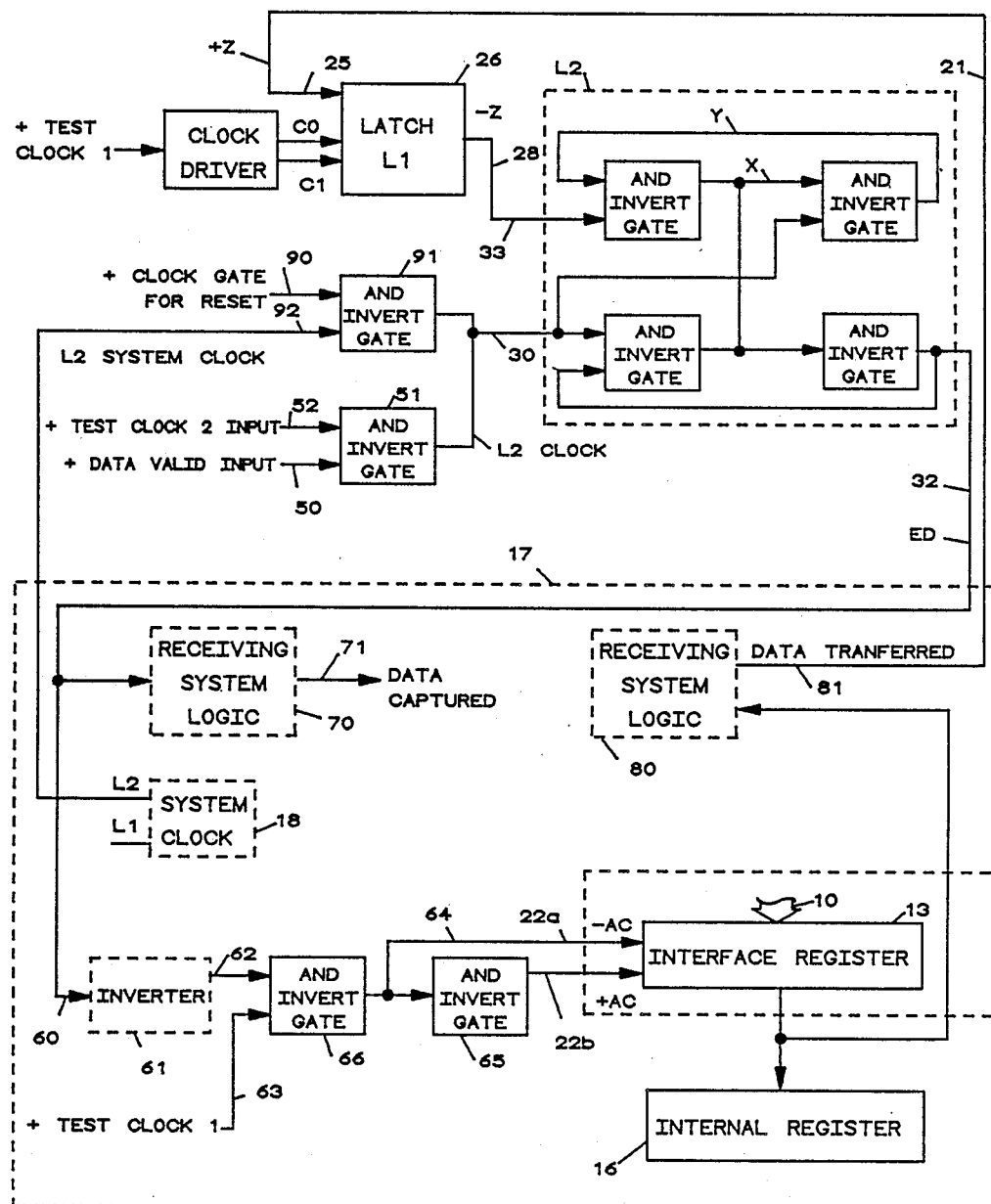
FIG. 2 is a combination circuit and system diagram showing the details of the latch circuit and the timing signals developed by the transmitter and computer.

With reference to FIG. 2, the asynchronous data bus 10 is connected to interface register 13. The parallel data bus may include 32 individual bit lines for parallel transfer of a 32-bit word. Interface register 13 has individual LSSD latches connected to each bit line. When the enabling clock signals on lines 22a and 22b are applied, the latches follow the changes on the bit lines, and the value in interface register 13 is the same as the value on the data bus 10.

At the point in time when the transmitting station wants to transfer the value on data bus 10 to the interface register 13, a Data Valid signal transmitted on a control line associated with data bus 10. The Data Valid signal is fed to the input 50 of And Invert gate 51. The other input 52 of this gate is used only to satisfy LSSD testing rules and is kept active during all normal system operations. When both input 50 and input 52 are high, the output on line 30 goes low, causing latch L2 to change state and develop an Edge Detect signal (ED) on output line 32.

The Edge Detect signal is fed to the input 60 of Inverter 61, causing output 62 to go low. The low signal on line 62 causes the output of the And Invert gate 66 to fall and terminates the +AC (asynchronous clock) signal on line 22a and, through the action of the And Invert gate 66, also terminates the −AC signal on line 22b.

With no clock signals being fed to it, interface register 13 ceases to follow the signals on data bus 10 and retains the value existent at the time the clock signals on lines 22a and 22b were terminated.

The Edge Detect signal on line 32 also feeds logic 70 in the receiving computer system which, either alone or in conjunction with the system clock, develops a Data Captured signal, indicating that the interface register 13 has been loaded with the data from data bus 10. The Data Captured signal is returned to transmitting station 11 over a control line 71 in data bus 10c. This signal is interpreted by the transmitting station as an indication that the data bus 10 may now be changed to a new value since the receiving station has captured the data. While the use of dedicated logic for the generation of the Data Captured signal is shown, it will be appreciated that the creation of this signal is entirely straightforward and could as well be developed by shared logic or by a software subroutine without departing from the invention. Note, however, that the creation of the Data Captured signal with a simple non-clocked combinational circuit optimizes the speed of data transfer and acknowledgement over bus 10 and the transfer and acknowledgement is effected with no system clocks in computer 17.

At this point, the computer system 17, under control of its own synchronous system clock 18, effects a transfer of the captured data in interface register 13 to its internal registers or a data bus. When this operation has been completed, special purpose logic 80, responsive to the transfer of data into a register or onto a data bus of computer 17, develops a Data Transferred signal on line 81 connected to line 21 leading to the interface control. The same or equivalent logic develops a Clock Gate for Reset signal which is applied to input 90 of And Invert gate 91.

Line 21 is connected to input 25 and latch 26. When input 25 goes high, output line 28 goes low, causing the signal to the data port D of latch L2 to go low. The computer system also activates the synchronous system clock 18 to the input 92 and And Invert gate 91. With both inputs 90 and 92 to And Invert gate 91 high, the output on line 30 goes low, causing latch L2 to be reset in preparation for another receive cycle.

Figure 3:
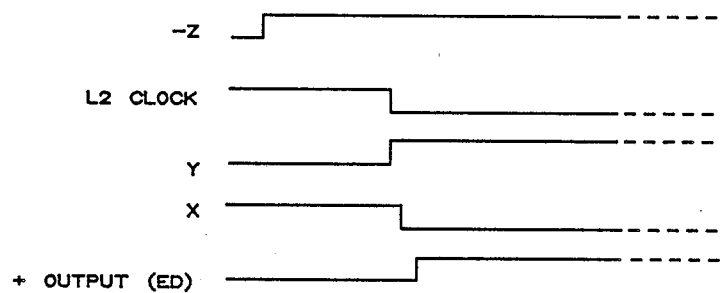
FIG. 3 is a timing diagram showing the signals developed within the LSSD latch.

The four And Invert modules are connected as shown to provide a glitch free latch L2. With reference to FIG. 3, the occurrence of a negative going transition on input 30 causes the internal lines X and Y to change levels as shown. The Edge Detect signal output on line 32 then goes high. A signal on line 33, connected to the arming input of latch L2, representing the absence of the Data Transferred signal, prevents latch L2 from responding to changes in signal level at input 30. When the signal on line 33 goes low, representing the presence of the Data Transferred signal, latch L2 is armed and therefore is able to respond to changes in the signal at the set input 30.

Figure 4:
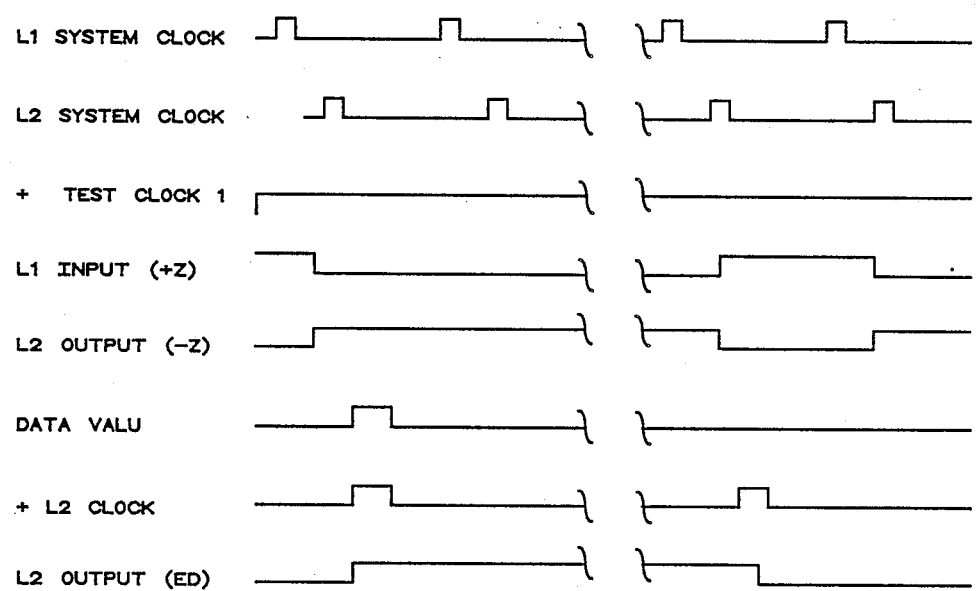
FIG. 4 is a timing diagram showing the relationship of various input, output and timing and system signals which are used in the invention.

FIG. 4 depicts this sequence of events, the asynchronous setting of latch L2 and the synchronous reset.

Various other inputs to individual And Invert gates are used for system test purposes, in accordance with well known LSSD techniques described in the references mentioned above.

I claim:

1. An LSSD interface between a transmitting station and a computer clocked asynchronously to said transmitting station, comprising:
   a. an edge triggered LSSD Flip flop having a first, arming input, and a second, set input;
   b. first control means coupled to said transmitting station and said LSSD flip flop for developing an output signal for application to said set input for setting said flip flop to the state representative of data signal from said transmitting station in response to the presence of said data signal from said transmitting station; and,
   c. means coupled to said LSSD flip flop and said computer and operating asynchronously to said transmitting station for applying a data transferred enabling signal from said computer to said first arming input to enable said flip flop to be set according to the input signal of said first control means whereby data may be transferred from said transmitting station to said computer which is clocked asynchronously to said transmitting station.

2. An interface according to claim 1 wherein said first control means comprises a first And Invert logic gate having an input energized by a data valid signal from said transmitting station and an output connected to said set input.

3. An interface according to claim 2 wherein said first control means further includes a second And Invert logic gate having a first input connected to be energized by a synchronous clock signal from said computer and a second input connected to be energized by a test signal and an output connected to said set input.

4. An interface according to claim 1, comprising:
   a. first register means connected to a data bus from said transmitting station;
   b. input control means for said register, said input control means allowing said register to follow the data from said data bus when gated and to retain the data from said data bus when degated; and,
   c. means responsive to the output of said LSSD flip flop for degating said clock input means to retain the data on said data bus in said first register means.

5. An interface according to claim 4 wherein said input control means comprises clock input means.

6. An interface according to claim 4 including:
   a. means responsive to the output of said LSSD flip flop for generating a data captured signal for transmission to said transmitting unit.

7. An interface according to claim 6 wherein said generating means comprises data captured logic responsive to the output of said LSSD flip flop for generating a data captured signal for transmission to said transmitting station.

8. An interface according to claim 7 wherein said data captured logic operates synchronous to said computer.

9. An interface according to claim 4 including:
   a. means responsively coupled to said first register and to said computer for developing said data transferred signal.

10. An interface according to claim 9 wherein said developing means comprises data transferred logic responsively coupled to said first register.

11. An interface according to claim 10 wherein said data transferred logic operates synchronous to said computer.

12. An interface according to claim 1 including:
   a. first interface register means connected to a data bus from said transmitting station;
   b. input control means for said first interface register, said input control means allowing said first interface register to follow said data signal when gated and to retain said data signal when degated by a data captured signal;
   c. means responsively coupled to said LSSD flip flop for generating said data captured signal for transmission to said input control means and said transmitting station; and,
   d. means responsively coupled to said first interface register and to said computer for enabling said data transferred signal.

13. An interface according to claim 12 wherein said generating means and said enabling means each comprise logic means.

14. An interface according to claim 13 wherein said logic means operate synchronous to said computer.

* * * * *